United States Patent [19]

Kreuz et al.

[11] 4,426,253

[45] Jan. 17, 1984

[54] HIGH SPEED ETCHING OF POLYIMIDE FILM

[75] Inventors: John A. Kreuz, Columbus; Christopher M. Hawkins, Clarksburg, both of Ohio

[73] Assignee: E. I. Du Pont de Nemours & Co., Wilmington, Del.

[21] Appl. No.: 327,060

[22] Filed: Dec. 3, 1981

[51] Int. Cl.³ .................. B29C 17/08; B44C 1/22; C03C 15/00; C03C 25/06
[52] U.S. Cl. ................... 156/668; 156/644; 156/654; 252/79.5
[58] Field of Search ............ 156/629, 633, 644, 654, 156/668, 659.1; 252/79.1, 79.5; 427/307

[56] References Cited

U.S. PATENT DOCUMENTS

| 3,361,589 | 1/1968 | Lindsey | 117/118 |
| 3,770,528 | 11/1973 | Hermes | 156/2 |
| 3,791,848 | 2/1974 | DeAngelo | 117/47 |
| 4,369,090 | 1/1983 | Wilson et al. | 156/644 |

FOREIGN PATENT DOCUMENTS 1415083 11/1975 United Kingdom .

Primary Examiner—William A. Powell

[57] ABSTRACT

An aqueous solution of ethyl or propyl alcohol containing a basic compound such as KOH is shown to etch the surface of polyimide material up to 400 times faster than conventional aqueous KOH etching solutions.

2 Claims, 2 Drawing Figures

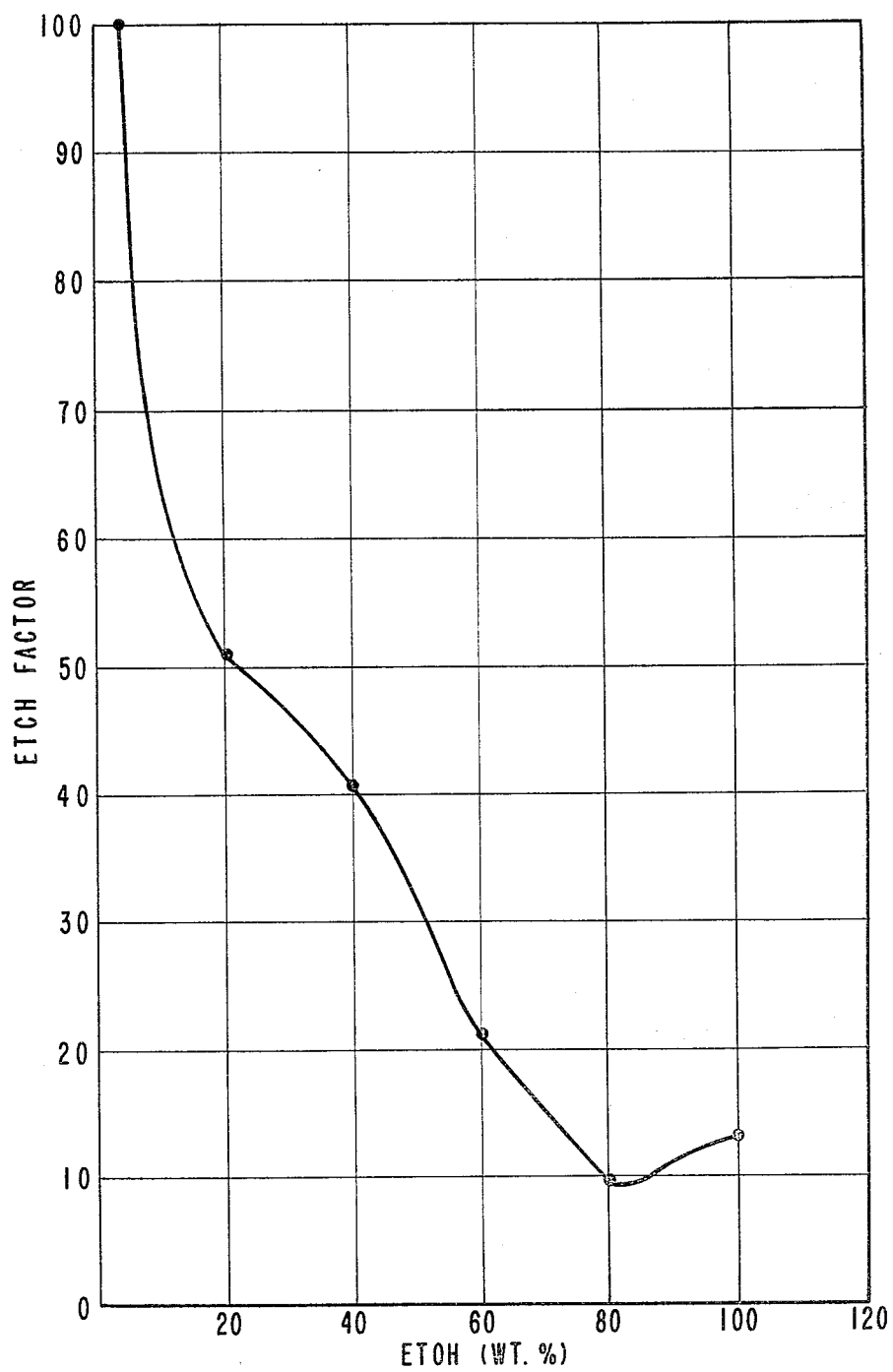

HIGH SPEED ETCHING OF POLYIMIDE FILM

BACKGROUND OF THE INVENTION

The subject invention relates to the etching of polyimide film. More particularly, the subject invention is a process for rapidly etching polyimide film by the use of an aqueous solution containing a basic etching component and ethyl alcohol, propyl alcohol or a combination of ethyl and propyl alcohol.

Surface etching treatments for polyimide materials are well known. It is known, for example, that the surface of polyimide film can be etched or delustered by treating the surface of the film with a solution of sodium hydroxide or potassium hydroxide in a high boiling glycol or glycol ether. Another known process for etching polyimide film comprises exposing the film to an aqueous solution of a basic compound and ethylene diamine, the latter being present in an amount in excess of its saturation point.

Another more complex process for etching polyimide film comprises coating the film with a thin layer of photoresist isoprene dimer having a viscosity of 100 to 400 centipoises at 25° C.; exposing this thin layer to a heat source, thereby hardening the layer; coating the film with a second layer of a similar photoresist isoprene dimer and again heat hardening; developing both photoresist layers to remove preselected sections thereof and leave corresponding portions of the polyimide unprotected; and immersing the polyimide coated with the photoresist layer in a hydrazine bath to etch away the unprotected portions of the polyimide.

A more direct process for etching polyimide film is disclosed in U.S. Pat. No. 3,361,589 issued on the application of Lindsey. This process comprises treating the film with an aqueous solution of a basic compound and/or any lower alcohol.

SUMMARY OF THE INVENTION

It has now been discovered that an aqueous solution of either ethyl or propyl alcohol, or a combination of ethyl and propyl alcohol, containing a basic compound will etch polyimide material up to about 400 times faster than an aqueous basic solution without the alcohol. In contrast, it has been discovered that an aqueous methanol solution containing a basic compound does not display this etch rate increase. Further, as detailed below, the subject invention reduces the etch factor of such a process, a very important parameter in the electronic circuitry field.

More specifically, the subject invention is a process for etching the surface of a polyimide material comprising contacting said surface with a 45-98% by weight aqueous solution of an alcohol selected from the group consisting of ethanol, n-propanol, isopropanol or a combination of these alcohols, said solution further containing from 0.05 to 50.0 percent by weight of a basic compound; the contact time of the film with the solution and the temperature of the solution being interdependent upon the speed and degree of etching desired.

BRIEF DESCRIPTION OF THE DRAWINGS

FIG. 2 is a graphic illustration of how variations of ethanol concentration in solutions of the subject invention affect etch factor.

DETAILED DESCRIPTION

Figure 1:
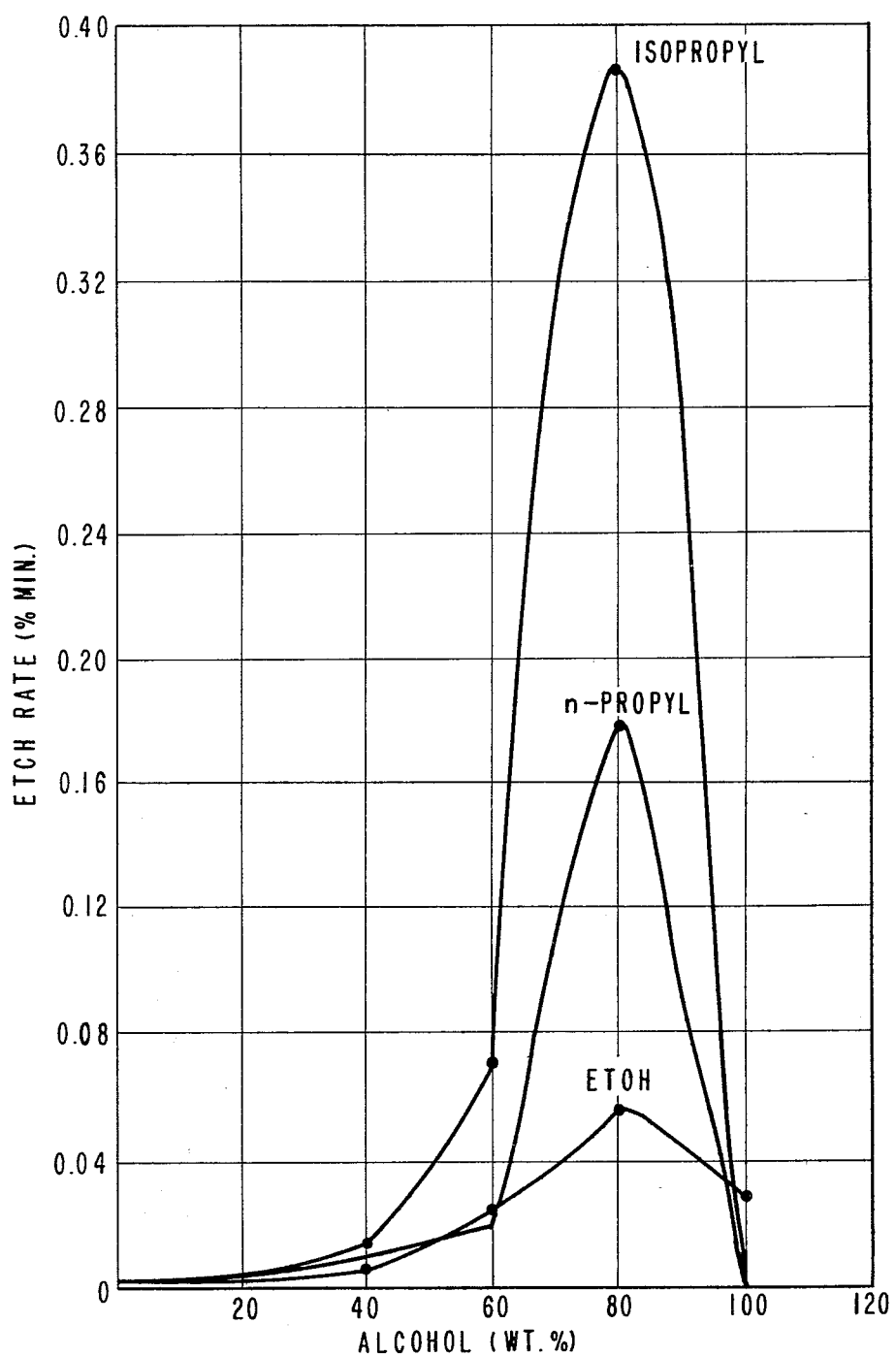
FIG. 1 is a graphic illustration of how variations of alcohol concentration in solutions of the subject invention affect etch rate.

The polyimide material to be treated in accordance with the process of the subject invention, generally in film form, includes any polyimide of a polyamide-acid having the formula

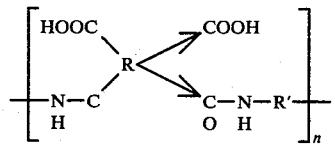

where the arrows denote isomerism, R is an organic tetravalent radical containing at least two carbon atoms, no more than 2 carbonyl groups of each polyamide-acid unit being attached to any one carbon atom of said tetravalent radical; R' is a divalent radical containing at least two carbon atoms, the amide groups of adjacent polyamide-acid units each attached to separate carbon atoms of said divalent radical; and n is a positive integer sufficient to provide the polyamide-acid with an inherent viscosity of at least 0.1. Typical of such a polyimide is "Kapton" polyimide film sold by E. I. du Pont de Nemours and Company, Inc. This film is formed from pyromellitic dianhydride and 4,4'-diamino-diphenyl ether having an average molecular weight ranging from 60,000 to 250,000. The above polyimides and their preparation are fully described in Edwards, U.S. Pat. No. 3,179,614, incorporated by reference hereinto.

The etching treatment of the subject invention comprises contacting the polyimide material with an aqueous solution of ethanol and/or propanol which also contains a basic compound. Some suitable basic compounds are those revealed in Lindsey, U.S. Pat. No. 3,361,589, and incorporated by reference hereinto. Specifically, these are (1) a carbonate, hydroxide, cyanide, borate, phosphate, pyrophosphate, sulfite, sulfide or silicate of an alkali metal including sodium, potassium, lithium, rubidium and cesium; (2) a carbonate, hydroxide, cyanide, borate or sulfide of ammonia; (3) an alkoxide of an alkali metal and (4) quarternary ammonium hydroxides having a general formula

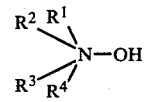

where R' and $R^2$ are the same or different alkyl radicals of one through four carbons, $R^3$ is alkyl of one through 18 carbons or alkenyl of one through 18 carbons and $R^4$ is alkyl of one through 18 carbons, alkenyl of 1 through 18 carbons, phenyl, alkylphenyl where the alkyl portion has one through 18 carbons, benzyl or alkylbenzyl where the alkyl portion has one through 18 carbons. However, preferred basic compounds are the hydroxides of the alkali metals, including sodium, potassium, lithium, rubidium and cesium, ammonium hydroxide and the above mentioned quarternary ammonium hydroxides.

The concentration of the basic compound is determined by the speed and degree of etching desired as the basic compound is the ingredient responsible for the etching. Generally speaking, this concentration can range from about 0.05 to 50.0 percent by weight of the solution.

Surprisingly, when the solution contains both a basic compound as described above and the proper concentration of ethanol, n-propanol, iso-propanol or any combination thereof, the rate at which this solution etches the surface of polyimide materials is increased up to about 400 fold. The concentration of alcohol in the solution can range from about 45 to 98 percent by weight of the solution. As evidenced by FIG. 1, a graph derived from the data of Example 1, alcohol concentrations lower than about 45 percent or higher than about 98 percent do not result in appreciable etch rate increases. FIG. 1 also shows that a more preferred concentration of alcohol is 75 to 85 percent, while the most preferred concentration is about 80 percent.

Also surprising is the discovery that the addition of alcohol as described above substantially improves a parameter known as "etch factor". Etch factor, well known in the electronic circuitry art, is a measure of the degree of etching taking place laterally within the polyimide material relative to the degree of etching taking place in a direction perpendicular to the surface of the polyimide material, generally expressed as a ratio of the former to the latter. Therefore, the smaller the etch factor, the cleaner the etching process, i.e., less lateral etching occurs within the polyimide material. FIG. 2, a graph derived from the data of Example 2, evidences the improvement in etch factor resulting from an etching solution of the subject invention.

It will be evident to those skilled in the art that the subject invention can be used to completely etch the surface of a thick polyimide film in order to arrive at a thin gauge polyimide film, a product that heretofor has been difficult to produce. Such an application of the subject invention is seen in Example IV.

Further, it will be evident to those skilled in the art that the etch rate of the subject invention is temperature dependent, the etch rate being increased as the temperature of the etching solution is increased. Likewise, the contact time required between the polyimide material and the etching solution is dependent upon the degree of etching desired. Therefore, the temperature of the etching solution can be anywhere between 0° C. and 80° C. and the contact time required between the polyimide material and the etching solution likewise can be anywhere above 0.01 minutes.

EXAMPLE I

Samples of 200H "Kapton" polyimide film (E. I. du Pont de Nemours and Company), after being weighed and measured for thickness, were each immersed in 29° C. aqueous 0.1 N KOH solutions which contained various amounts of ethyl and propyl alcohol as listed in Table 1 below. After a known period of time in the solution, the samples were removed, rinsed and measured for weight loss, the etch rate k being calculated as percent weight loss per minute. For control purposes, the etch rate of 0.1 N KOH was measured at about 0.0025%/min. FIG. 1 is a graphical representation of the following data:

TABLE 1

| Weight Percent Alcohol* | k (%/min) |
|---|---|
| Ethanol | |

TABLE 1-continued

| Weight Percent Alcohol* | k (%/min) |
|---|---|
| 40.0 | 0.006 |
| 60.0 | 0.024 |
| 80.0 | 0.056 |
| 100.0 | 0.028 |
| n-Propanol | |
| 40.0 | 0.012 |
| 60.0 | 0.020 |
| 80.0 | 0.178 |
| 100.0 | 0.000 |
| Iso-Propanol | |
| 40.0 | 0.014 |
| 60.0 | 0.070 |
| 80.0 | 0.387 |
| 100.0 | 0.000 |

*The % alcohol (by wt.) represents the alcohol/water composition used to dissolve and dilute the potassium hydroxide. There is a small correction to accountfor the water in the solid potassium hydroxide, i.e., subtract 0.1% from the listed wt. % alcohol.

COMPARATIVE EXAMPLE

When the procedure used in Example I was repeated using methanol in concentrations ranging from 20 to 100 weight percent in place of ethanol or propanol, it was found that no increase in etch rate occurred.

EXAMPLE II

Barrier tape, insoluble in solutions of the subject invention, was punched with a hole and firmly pressed onto a 1 inch by 4 inch strip of 200H "Kapton" polyimide film. The film was immersed into a 29° C. 1.0 N KOH solution of various concentrations of ethanol and water as tabulated below, removed from the solution, rinsed and dried for 30 minutes at 100° C. The amount of perpendicular etch was measured as thickness loss and the amount of lateral etch, i.e., the amount of etch taking place from the walls of the holes laterally through the film, was determined using a model 6C Nikon Shadowgraph. As seen in Table 2 below, etch factor is listed as the ratio of lateral etch to perpendicular etch, the results graphically illustrated in FIG. 2.

TABLE 2

| Ethanol (wt. %) | Perpendicular Etch (mils) | Lateral Etch (mils) | Etch Factor |
|---|---|---|---|
| 0 (H2O/KOH) | 0.38 | 51.0 | 134 |
| 20 | 0.28 | 14.3 | 51 |
| 40 | 1.05 | 43.2 | 41 |
| 60 | 1.02 | 21.2 | 20.8 |
| 80 | 0.94 | 9.3 | 9.9 |
| 100 | 1.20 | 16.0 | 13.0 |

EXAMPLE III

This example is to illustrate that the etch rate of the process of the subject invention is temperature dependent.

Samples of 200H "Kapton" polyimide film were treated at various temperatures with an 80% ethanol/20% water solution of 1 N KOH. The samples were withdrawn from the solution, dried, measured for loss of thickness and the etch rate k calculated. The results were as follows:

TABLE 3

| T °C. | Time (min) | Thickness (mils) | k (mils/min) |
|---|---|---|---|
| 30 | 30 | .33 | .022 |

TABLE 3-continued

| T °C. | Time (min) | Thickness (mils) | k (mils/min) |
|---|---|---|---|
| 40 | 10 | .24 | .075 |
| 50 | 3 | .64 | .120 |

EXAMPLE IV

This Example is to illustrate that a thick gauge polyimide film can be etched using the composition of the subject invention to arrive at a thin gauge polyimide film.

A 1.0 mil thick 8.5×5.5 inch polyimide film (200H "Kapton" polyimide film sold by E. I. du Pont de Nemours and Company) was placed in a 1 N KOH solution of 80 percent ethyl alcohol/20 percent water for 90 minutes, water washed and dried in a hot air oven, 30 minutes at 100° C. and 30 minutes at 400° C. The resulting film was 0.25 mil thick and displayed excellent gauge uniformity and clarity.

We claim:

1. A process for etching the surface of a polyimide material comprising contacting said surface with an aqueous solution consisting essentially of a 75–85% by weight aqueous solution of an alcohol selected from the group consisting of ethanol, n-propanol, isopropanol or a combination of these alcohols, and from 0.05 to 50 percent by weight of a basic compound selected from the group consisting of NaOH and KOH; the contact time of the surface with the solution and the temperature of the solution being interdependent upon the speed and degree of etching desired.

2. The process of claim 1 wherein the alcohol is present in the solution at a concentration of about 80 percent.

* * * * *